United States Patent
Dewey et al.

(10) Patent No.: US 10,644,123 B2
(45) Date of Patent: May 5, 2020

(54) SYSTEMS, METHODS, AND APPARATUSES FOR IMPLEMENTING A HIGH MOBILITY LOW CONTACT RESISTANCE SEMICONDUCTING OXIDE IN METAL CONTACT VIAS FOR THIN FILM TRANSISTORS

(71) Applicant: Intel Corporation, Santa Clara, CA (US)

(72) Inventors: Gilbert Dewey, Hillsboro, OR (US); Van H. Le, Portland, OR (US); Rafael Rios, Austin, TX (US); Jack T. Kavalieros, Portland, OR (US); Shriram Shivaraman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/325,333

(22) PCT Filed: Sep. 30, 2016

(86) PCT No.: PCT/US2016/054847
§ 371 (c)(1),
(2) Date: Feb. 13, 2019

(87) PCT Pub. No.: WO2018/063347
PCT Pub. Date: Apr. 5, 2018

(65) Prior Publication Data
US 2019/0172921 A1    Jun. 6, 2019

(51) Int. Cl.
*H01L 29/45* (2006.01)
*H01L 29/10* (2006.01)
(Continued)

(52) U.S. Cl.
CPC ............ *H01L 29/45* (2013.01); *H01L 21/443* (2013.01); *H01L 21/76843* (2013.01);
(Continued)

(58) Field of Classification Search
CPC ............... H01L 29/45; H01L 29/78618; H01L 29/78693; H01L 21/443; H01L 21/76843;
(Continued)

(56) References Cited

U.S. PATENT DOCUMENTS

2005/0275038 A1* 12/2005 Shih et al. .......... H01L 29/7869
257/382
2007/0187760 A1* 8/2007 Furuta et al. ..... H01L 29/41733
257/347
(Continued)

OTHER PUBLICATIONS

International Preliminary Report on Patentability for International Patent Application No. PCT/US2016/054847 dated Apr. 11, 2019, 10 pgs.
(Continued)

*Primary Examiner* — Thinh T Nguyen
(74) *Attorney, Agent, or Firm* — Schwabe, Williamson & Wyatt, P.C.

(57) ABSTRACT

In accordance with disclosed embodiments, there are provided systems, methods, and apparatuses for implementing a high mobility low contact resistance semiconducting oxide in metal contact vias for thin film transistors. For instance, there is disclosed in accordance with one embodiment an oxide semiconductor transistor, having therein: a substrate layer; a channel layer formed atop the substrate; a metal gate and a gate oxide material formed atop the semiconducting oxide material of the channel layer; spacers positioned adjacent to the gate and gate oxide material; a dielectric layer formed atop the channel layer, the dielectric layer encompassing the spacers, the gate, and the gate oxide material; contact vias opened into the dielectric material
(Continued)

forming an opening through the dielectric layer to the channel layer; a high mobility liner material lining the contact vias and in direct contact with the channel layer, the high mobility liner formed from a high mobility oxide material; and metallic contact material filling the contact vias opened into the dielectric material and separated from the channel layer by the high mobility liner of the contact vias. Other related embodiments are disclosed.

25 Claims, 12 Drawing Sheets

(51) Int. Cl.
    *H01L 21/443*     (2006.01)
    *H01L 29/786*     (2006.01)
    *H01L 29/417*     (2006.01)
    *H01L 29/49*     (2006.01)
    *H01L 21/768*     (2006.01)
    *H01L 23/522*     (2006.01)
    *H01L 23/532*     (2006.01)

(52) U.S. Cl.
    CPC .... *H01L 23/5226* (2013.01); *H01L 23/53204* (2013.01); *H01L 29/10* (2013.01); *H01L 29/41733* (2013.01); *H01L 29/49* (2013.01); *H01L 29/7869* (2013.01); *H01L 29/78618* (2013.01); *H01L 29/78693* (2013.01)

(58) Field of Classification Search
    CPC ............. H01L 23/5226; H01L 23/5204; H01L 29/7864
    USPC ..... 257/43, 64, 65, 66; 438/85.86, 104, 150, 438/166
    See application file for complete search history.

(56) References Cited

U.S. PATENT DOCUMENTS

| | | |
|---|---|---|
| 2009/0283763 A1 | 11/2009 | Park et al. |
| 2013/0062602 A1 | 3/2013 | Jeon et al. |
| 2015/0048359 A1 | 2/2015 | Fukase et al. |
| 2016/0093742 A1 | 3/2016 | Momose et al. |
| 2016/0148845 A1 | 5/2016 | Sunamura et al. |

OTHER PUBLICATIONS

International Search Report and Written Opinion for International Patent Application No. PCT/US2016/054847 dated Jun. 29, 2017, 13 pgs.

* cited by examiner

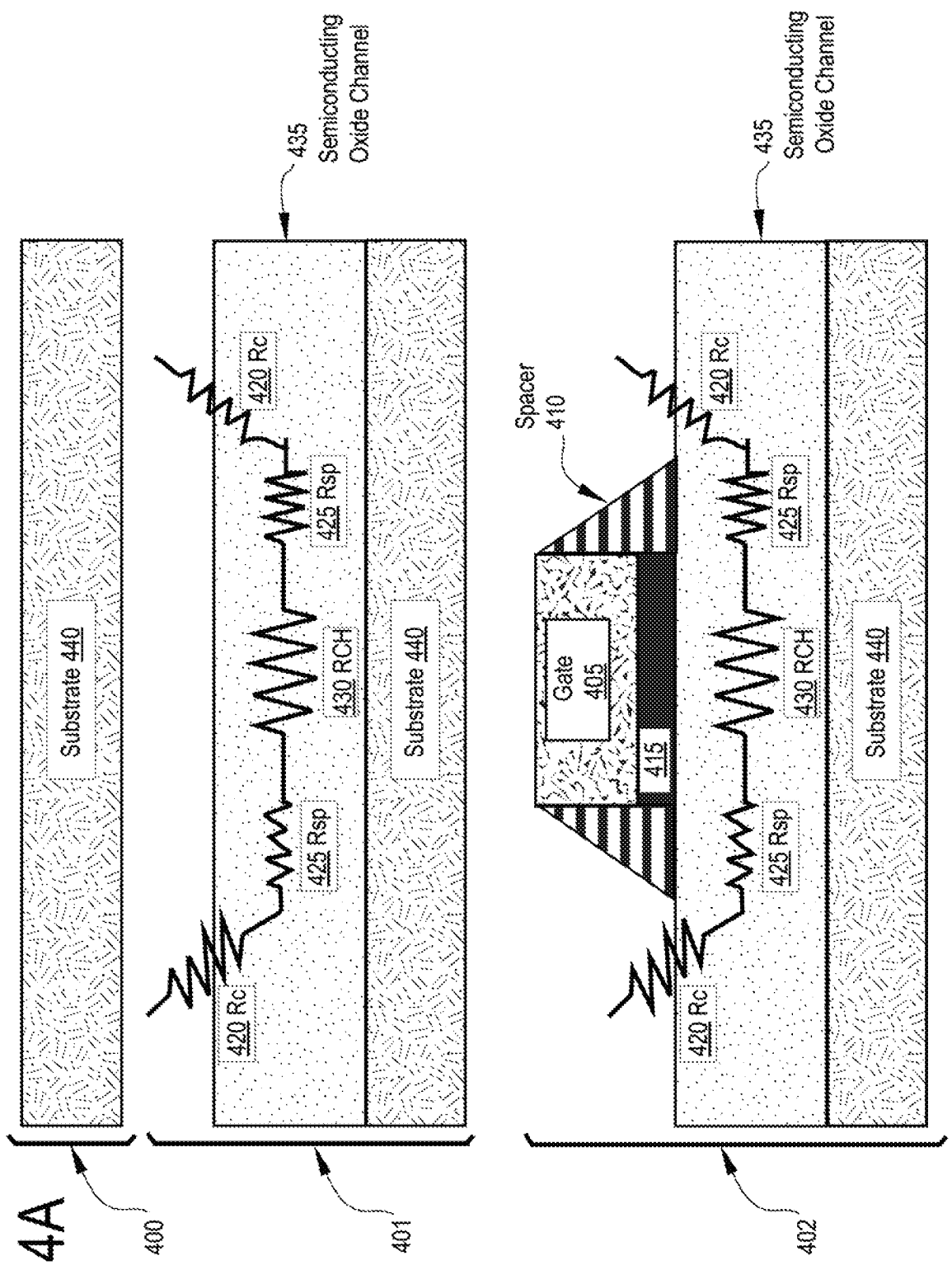

SYSTEMS, METHODS, AND APPARATUSES FOR IMPLEMENTING A HIGH MOBILITY LOW CONTACT RESISTANCE SEMICONDUCTING OXIDE IN METAL CONTACT VIAS FOR THIN FILM TRANSISTORS

CROSS-REFERENCE TO RELATED APPLICATION

This patent application is a U.S. National Phase Application under 35 U.S.C. § 371 of International Application No. PCT/US2016/054847, filed Sep. 30, 2016, entitled "SYSTEMS, METHODS, AND APPARATUSES FOR IMPLEMENTING A HIGH MOBILITY LOW CONTACT RESISTANCE SEMICONDUCTING OXIDE IN METAL CONTACT VIAS FOR THIN FILM TRANSISTORS," which designates the United States of America, the entire disclosure of which is hereby incorporated by reference in its entirety and for all purposes.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The subject matter described herein relates generally to the field of semiconductor and electronics manufacturing, and more particularly, to systems, methods, and apparatuses for systems, methods, and apparatuses for implementing a high mobility low contact resistance semiconducting oxide in metal contact vias for thin film transistors.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to embodiments of the claimed subject matter.

In semiconductor manufacturing oxide semiconductors have applications in memory and back end transistors because they can be deposited at low temperature and do not require a native substrate. Moreover, oxide semiconductors can be integrated vertically (3D) into the semiconductor manufacturing process as thin film transistors.

Unfortunately, oxide semiconductors exhibit a wider band gap than group IV and III-V semiconductors and may therefore suffer from high contact and access resistances. For instance, oxide semiconductors often exhibit large band gaps and low carrier density. Moreover, because such oxide semiconductors are not doped in a conventional implant or growth method, the resulting contact resistance and access resistances outside the gate can be challenging to achieve sufficiently low values necessary to make the technology viable for memory or logic applications.

The present state of the art may therefore benefit from the means for implementing a high mobility low contact resistance semiconducting oxide in metal contact vias for thin film transistors as described herein.

BRIEF DESCRIPTION OF THE DRAWINGS

Embodiments are illustrated by way of example, and not by way of limitation, and will be more fully understood with reference to the following detailed description when considered in connection with the figures in which:

FIGS. 4A, 4B, 4C, 4D, and 4E depict exemplary process flows for building a high mobility low contact resistance semiconducting oxide in metal contact vias for thin film transistors in accordance with described embodiments;

DETAILED DESCRIPTION

Figure 1:
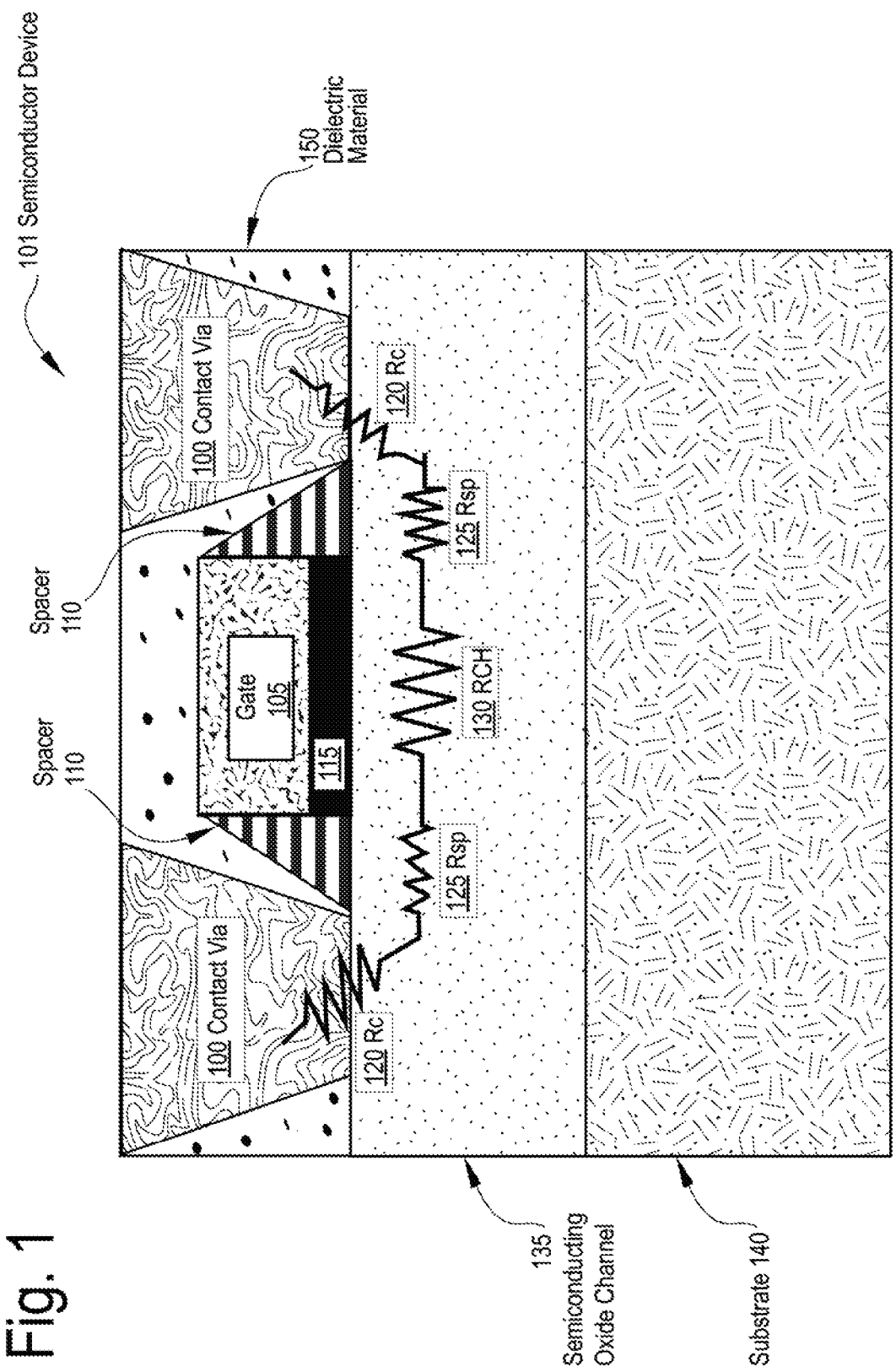
FIG. 1 depicts an exemplary semiconductor device in accordance with which embodiments may operate.

Described herein are systems, methods, and apparatuses for implementing a high mobility low contact resistance semiconducting oxide in metal contact vias for thin film transistors. For instance, there is disclosed in accordance with one embodiment an oxide semiconductor transistor, having therein: a substrate layer; a channel layer formed atop the substrate; a metal gate and a gate oxide material formed atop the semiconducting oxide material of the channel layer; spacers positioned adjacent to the gate and gate oxide material; a dielectric layer formed atop the channel layer, the dielectric layer encompassing the spacers, the gate, and the gate oxide material; contact vias opened into the dielectric material forming an opening through the dielectric layer to the channel layer; a high mobility liner material lining the contact vias and in direct contact with the channel layer, the high mobility liner formed from a high mobility oxide material; and metallic contact material filling the contact vias opened into the dielectric material and separated from the channel layer by the high mobility liner of the contact vias.

In the following description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

In addition to various hardware components depicted in the figures and described herein, embodiments further include various operations which are described below. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Any of the disclosed embodiments may be used alone or together with one another in any combination. Although various embodiments may have been partially motivated by deficiencies with conventional techniques and approaches, some of which are described or alluded to within the specification, the embodiments need not necessarily address or solve any of these deficiencies, but rather, may address only some of the deficiencies, address none of the deficiencies, or be directed toward different deficiencies and problems which are not directly discussed.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 depicts an exemplary semiconductor device 101 in accordance with which embodiments may operate.

In particular, there is depicted a semiconductor device 101 having therein a substrate 140, a semiconducting oxide channel 135 material forming the channel layer, and a dielectric material 150 fully encompassing the contact vias 100 which are electrically connected symmetrically. For instance, the channel layer may be formed from a crystalline semiconducting oxide material or an amorphous semiconducting oxide material, sometimes referred to as an Amorphous Oxide Semiconductor (AOS) material.

As can be observed, there is contact resistance Rc 120 leading as well as spreading resistance Rsp 125 and channel resistance RCH 130.

Contact resistance Rc 120 is the resistance between the metal of the contact via 100 and the semiconducting oxide channel 135 interface. Spreading resistance Rsp 125 is further depicted underneath the spacers 110. Lastly, there is the channel resistance RCH 130 which is the resistance being modulated by the gate 105. The resistances are symmetric to each side between the source and drain contact vias 100.

Also depicted are the spacers 110 surrounding the gate 105 which rests upon the gate oxide material 115.

The depicted semiconductor device 101 is representative of a large band gap amorphous oxide semiconductor resulting in both a high resistance under the spacer 110 and a high contact resistance Rc 120 to the metal and consequently a large access resistance.

Oxide semiconductors have oxygen within them and therefore they are typically bound to a metal such as Indium, or tin, or Gallium and Zinc, etc. The oxide semiconductors exhibit a wide band gap and are therefore considered a wide band gap material system.

Frequently the barrier tends to pin in the mid-gap. Therefore, with silicon, if the band gap is 1.1, a barrier height of around 0.6 EV will typically result, which an unacceptably large barrier height. However, for a wide band gap material which is not doped, the barrier height is pinned in the middle of the band gap, resulting in as much as a 1.5 EV barrier for the carriers to go into the semiconducting oxide channel 135 from the metal forming the contact vias 100.

Consequently, the high contact resistance Rc 120 due to the metal contact of the contact via 100 to the wide band gap of the un-doped, semiconducting oxide material of the semiconducting oxide channel 135 results in poor performance of the semiconductor device 101 as observed through potentially orders of magnitude lower current.

Figure 2:
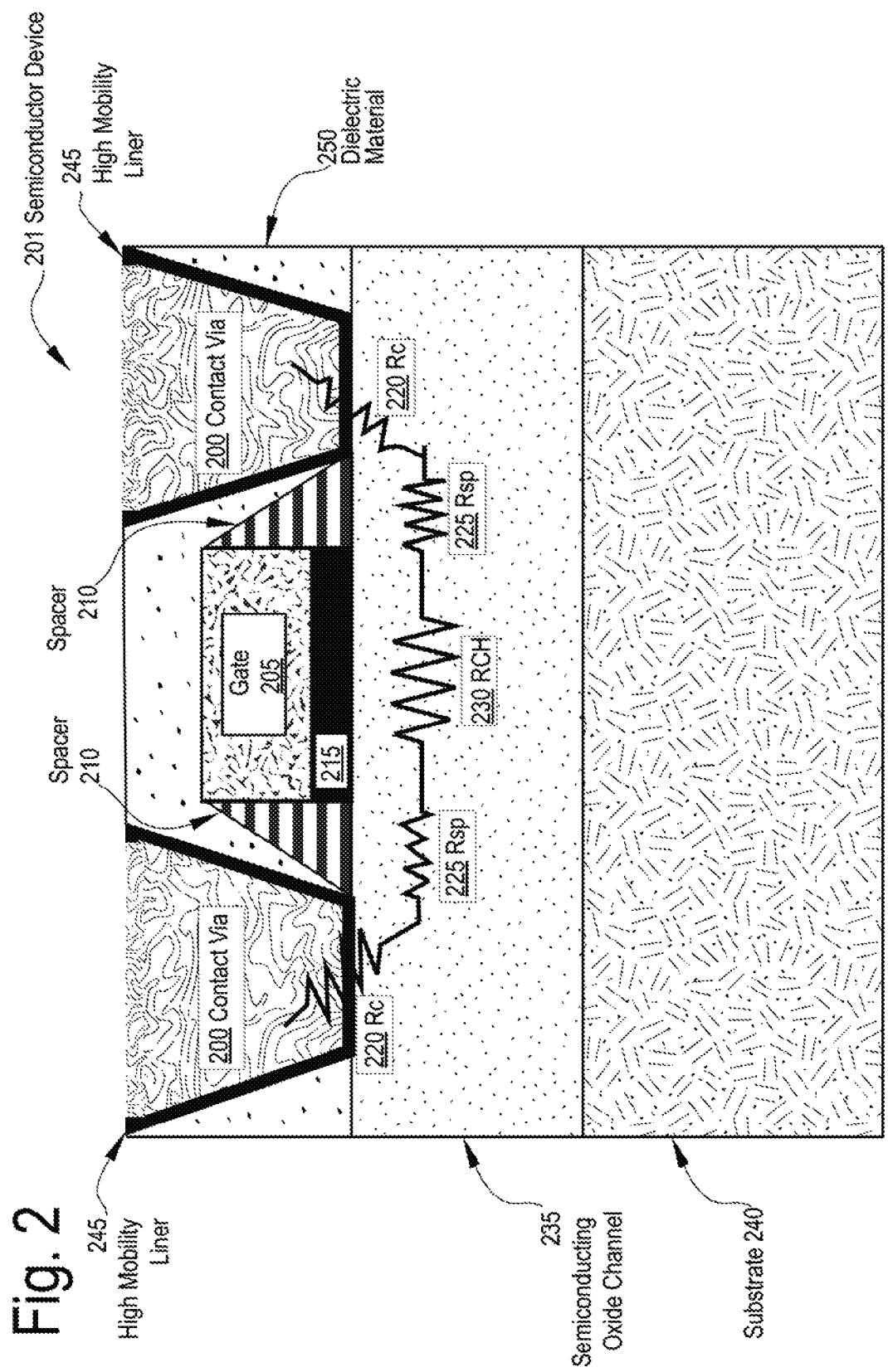
FIG. 2 depicts another exemplary semiconductor device in accordance with which embodiments may operate.

FIG. 2 depicts another exemplary semiconductor device 201 in accordance with which embodiments may operate.

As depicted, there is a substrate 240 upon which the semiconducting oxide channel 235 material resides. Further depicted is the dielectric material 250 fully encompassing the contact vias 200 which are electrically connected symmetrically through the semiconducting oxide channel 235 layer. The semiconducting oxide channel 235 layer may be a crystalline oxide material or an amorphous oxide material.

Surrounding the contact vias 200 is a layer of a high mobility oxide material forming a high mobility liner 245. The high mobility liner 245 material being chosen for its high mobility characteristics.

As can be observed, there is further depicted the reduced contact resistance Rc 220 leading to spreading resistance Rsp 225 and channel resistance RCH 230. Beneath the gate 205 is a gate oxide material 215, with the spacers surrounding the gate oxide material 215 and providing separation from the gate 205 and gate oxide materials from the contact vias 200 to prevent shorting.

Because many types of oxide semiconductors exist with a large range of mobility, contact resistance, and carrier density, it is advantageous to use an oxide semiconductor material as a channel which exhibits optimal gating properties, while using a second type of oxide material for the high mobility liner 245 surrounding the contact vias 200 in the source and drain areas to benefit from the higher mobility and carrier density and therefore reduce the access resistance to the thin film transistor.

Moreover, when contacting a wide band gap amorphous oxide directly with a metal a large Schottky barrier is exhibited which prevents low access resistance. A Schottky barrier is the potential energy barrier for electrons formed at a metal to semiconductor junction, the value of which depends on the combination of metal and semiconductor materials chosen.

A metal contact to a wide band gap and low doped semiconductor similarly results in a large Schottky barrier and thus poor contact resistance.

Described embodiments therefore reduce the metal semiconductor Schottky barrier height in the contact of an oxide semiconductor by introducing a second oxide semiconductor of higher mobility and lower band gap utilizing high mobility materials such as $SnO_2$, $SbO_2$, $InO_2$, ITO, TiO, ZO in the via prior to the deposition of the contact metal.

Oxide semiconductors do not require deposition upon a crystal lattice substrate and need not be latticed matched to silicon and can therefore be grown in the back end. For instance, oxide semiconductors may be grown or deposited upon a side wall and can be deposited in any manner upon the microprocessor, wherever the material is desired, resulting in significant versatility for the material in the semiconductor manufacturing process.

For instance, it is therefore possible to stack transistors or place oxide transistors above the actual logic transistors which reside below within the silicon.

Many oxide semiconducting materials, amorphous or otherwise, can be deposited via sputter, Chemical Vapor Deposition (CVD), or Atomic Layer Deposition (ALD) methods at low temperatures which is conducive to deposition in the contact via prior to deposition of the contact metal, so as to form the high mobility liner 245 depicted surrounding the contact vias 200 metallic material.

Such higher mobility and/or lower EG oxide semiconductors in the via therefore serve two purposes. First, they serve to "unpin" the metal to channel semiconductor interface and lower the Schottky barrier height. If sufficiently thick and graded from semiconducting at the interface with the semiconductor to being more metallic close to the metal contact, then the contact resistance can be unpinned and greatly reduced which in turn enables low resistance ohmic contact to wide band gap and low carrier density oxide thin film transistors.

Because thin film oxide semiconductors are not easily doped in the way crystalline semiconductors are conventionally doped there simply are not good adequate solutions to sufficiently lower contact resistance. Crystalline semiconductors resort to high doping densities to induce small tunnel barriers and will therefore form low resistance ohmic contacts. Oxide semiconductors do not yet have the same capability of impurity doping via implant or growth to increase carrier concentration and therefore new techniques are needed, such as those described herein.

Experimental Indium-Gallium-Zinc Oxide (IGZO) thin film transistors have been fabricated with excellent gating characteristics. However, such IGZO thin film transistors exhibit problematically large contact resistances due to the wide band gap of the IGZO and the low carrier density in the source and drain. For instance, while such materials provide improved gate control, observed EG is 3.2 eV and metal contact resistance is unacceptably high. Higher mobility and smaller EG oxide semiconductors such as ITO and IZO have been fabricated and have lower contact resistance and such materials may therefore be deposited into the via by CVD or PVD methods to reduce the metal semiconductor Schottky barrier height to the IGZO TFT observed levels.

Channel materials such as the semiconducting oxide channel 235 material may be therefore selected for optimum gating and low off-state leakage properties while introducing a second semiconducting oxide depicted here as the high mobility liner 245 material which provides for the ability to select for properties that would have a lowest access resistance.

The semiconductor device 201 depicted here combines the best semiconducting oxide channel 235 properties with a low contact resistance Rc 220 by using the second oxide material forming the high mobility liner 245.

The high mobility liner 245 material when combined with the semiconducting oxide channel 235 material therefore forms source and drain region having low access and improved contact resistance for thin film resistors as described herein.

The high mobility liner 245 and the semiconducting oxide channel 235 material permit the gate 205 to turn on and off the semiconducting oxide channel 235 with reduced total access resistance.

The channel resistance RCH 230 will optimally be the primary resistance encountered within a semiconductor device 201. However, for reasons which are unavoidable the semiconducting oxide channel 235 must be connected to the external load using contact vias 200 and consequently, there is also contact resistance Rc 220 which is not controllable by the gate 205.

Because the gate 205 is to modulate the resistance of the semiconductor device 201 it is desirable for the contact resistance Rc 220 to be as low as possible.

Using only amorphous oxide materials as is depicted at the semiconductor device 101 of FIG. 1 without the high mobility liner 245 depicted here surrounding the contact vias 200 there will result large band gaps resulting in increased resistance.

A band gap is an energy range of the semiconductor material where no electron states may exist. The band gap generally refers to the energy differences (in electron volts) between the top of the valence band and the bottom of the conduction band of the semiconductor material. If the valence band is completely full and the conduction band is completely empty, then electrons cannot move through the material; however, if some electrons transfer from the valence band to the conduction band, then current may flow. Therefore, the band gap is an important factor determining the electrical conductivity of the materials selected. Substances with large band gaps are generally insulators, those with smaller band gaps are semiconductors, while conductors either have very small band gaps or none, because valence and conduction bands overlap.

Material selection and optimization may contribute to reduced contact resistance Rc 220 which is important as the contact resistance Rc 220 is not controlled by the gate and therefore presents an undesirable anomaly in the semiconductor device 201. While contact resistance Rc 220 cannot be eliminated wholly, by reducing the contact resistance Rc 220 as much as possible, the maximum modulation will therefore originate from the gate's 205 direct control.

Amorphous oxide materials such as those which may optionally be utilized to form the depicted semiconducting oxide channel 235 material exhibit large band gaps which make it more difficult to make good contact with the material. Therefore, a secondary material is selected forming the high mobility liner 245 which exhibits both a smaller band gap and also a higher mobility, such as by utilizing a high mobility oxide material for the high mobility liner 245.

The mobility of the material characterizes how fast carriers or electrons move through the particular material. Therefore, a high mobility material implies also that the material exhibits a high conductivity.

Therefore, a high mobility liner 245 material is utilized surrounding the source and drain contact vias 200 regions thereby reducing the contact resistance Rc 220, hence the depiction of the high mobility liner 245 coating or lining the internals of the contact vias separating the metal forming the contact via 200 from the semiconducting oxide channel 235 material below.

Using the two distinct semiconducting oxides formed from both the semiconducting oxide channel 235 material and the high mobility liner 245 material drastically reduces problematic high contact resistances Rc observed in prior solutions between the contact vias 200 and the channel region.

The contact resistance Rc 120 exhibited at the semiconductor device 101 of FIG. 1 are problematically high and are not modulated by the gate 105 of the semiconductor device 101 at FIG. 1. Through the use of a higher mobility oxide material forming the high mobility liner 245 around the source and drain contact vias 200 a potentially lower band gap is provided than with the material forming the semiconducting oxide channel 235 region where the channel resistance RCH 230 is observed. Consequently, the contact resistance Rc 220 is lowered due to the greater conductivity of the high mobility liner 245 material.

Because amorphous oxide materials are new to the marketplace they have not yet been successfully integrated into thin film transistors in the manner which is described herein. Consequently, alternative solutions were pursued to reduce the contact resistance Rc 220 encountered in such devices. However, such prior methodologies have not been successful in reducing the contact resistance Rc 220 to the extent observed in the depicted semiconducting device 201 having the high mobility liner 245 surrounding the contact vias 200 in the Source/Drain region for low access and improved contact resistance Rc 220 through the combination of the high mobility liner 245 in conjunction with the semiconducting oxide channel 235 material.

There are different families of oxide semiconducting materials from which the semiconducting oxide channel 235 material and the high mobility liner 245 material may be selected. Some oxide semiconductors exhibit a wide band gap while others have a very small band gap. Typically, the wide band gap oxide semiconductors are desirable because they are easy to control providing very large on/off ratios meaning they provide very high on currents and very low off currents.

However, certain narrow band gap oxide semiconductors such as Indium oxide, are highly conductive and yet still provide very small band gaps. Such materials are not suitable for the semiconducting oxide channel 235 material. However, these same semiconducting oxide materials, because of their very high mobility and low band gap, may be utilized for the high mobility liner 245 material surrounding the contact vias 200.

As depicted here, a via (e.g., a hole is opened) is etched down to the semiconducting oxide channel 235 layer and then the opened via (later to be the contact via 200) makes direct contact with the top of the transistor at the source and drain regions.

Because the semiconducting oxides may be deposited anyway, without growing them from a crystal lattice, the opened via may therefore be lined with the selected high mobility liner 245 material, thus forming the high mobility liner 245 along the walls of the opened via etched down to the semiconducting oxide channel 235 layer.

Because the semiconducting oxides may be deposited at any time and at any stop of the process, a high mobility semiconducting oxide material forming the high mobility liner 245 is therefore deposited prior to depositing the metallic material which forms the contact via 200. In such a way, it is possible to line the opened via with the higher mobility and smaller band gap oxide or amorphous oxide to provide a greatly reduced contact resistance Rc 220 between the metallic material forming the contact via 200 and the high band gap semiconducting oxide channel 235 layer material forming the channel. In some cases the two disparate semiconducting oxide materials selected for the channel 235 layer and the high mobility liner 245 provide for exponentially reduced contact resistances Rc 220.

Therefore, rather than simply contacting the contact metal of the contact via 200 directly with the semiconducting oxide of the channel 235 layer a bi-layer oxide is formed between the metallic material of the contact and then channel, going first through the high mobility liner 245 material and then into the higher band gap semiconducting oxide channel 235 material which results in the same effect as having a doped layer with silicon, but the contact layer is actually a high mobility low band gap oxide material forming the depicted high mobility liner 245 which operates as a transition layer.

In such a way, the additional semiconducting oxide layer forming the high mobility liner 245 forms a kind of step for the electrons attempting to cross the barrier. Rather than having to cross a high barrier height at, for example, 1 eV presenting a tunneling probability for the electrons to reflect off rather than going through, the barrier is effectively broken up into smaller segments. For instance, even if there were ten barriers each at 0.1 eV, thus adding up to the same total 1.0 eV exemplary barrier, the electrons would pass through much more easily compared to having to surpass the 1.0 eV barrier in a single step.

In accordance with alternative embodiments therefore, multiple high mobility liners 245 are utilized rather than just one, each providing a different layer of semiconducting oxide forming multiple intermediate barrier heights to further reduce the contact resistance Rc 220 encountered by the electrons passing from the contact vias 200 into the semiconducting oxide channel 235.

Because the semiconducting oxides may be deposited via atomic layer deposition it is possible to deposit them in any aspect ratio and because the atomic layer deposition process fills tiny holes it is possible to control the deposited material forming, for instance, a few nanometers of a first semiconducting oxide liner of a first type and then a few nanometers of a second semiconducting oxides material of a second type to build the step by step barrier height transitions.

Conversely, crystalline materials do not permit such finely controlled layers due to the time, temperature, and lattice mismatch problems encountered as differing materials of different band gaps such as silicon and germanium will not epitaxially grow on top of each other. Further still, raising the temperature sufficient to grow the crystalline lattice is likely to destroy or close the very small hole forming the opened via. Conversely, atomic layer deposition permits low temperature deposition of the chosen semiconducting oxide liner material forming the depicted high mobility liner 245.

Figure 3:
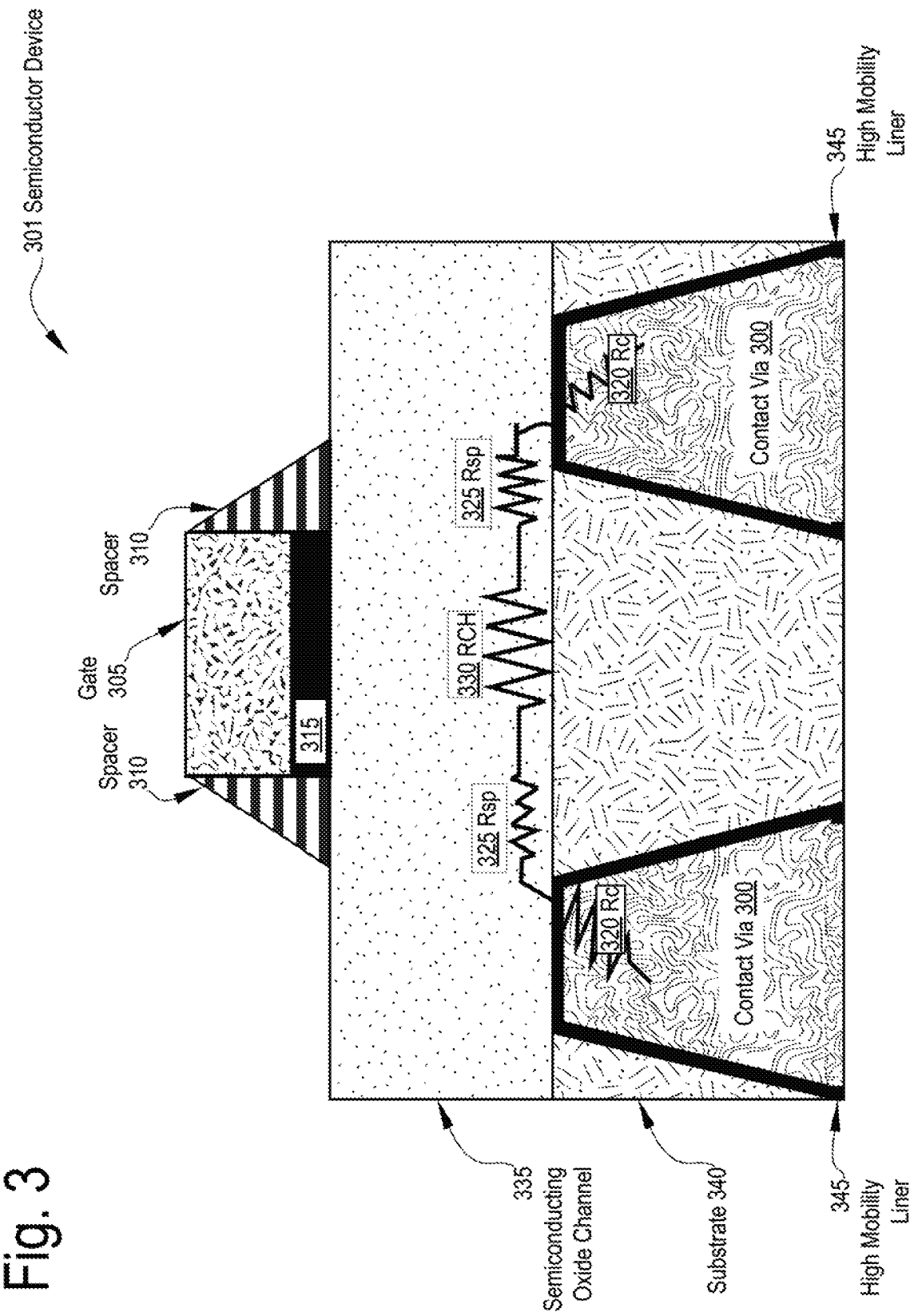
FIG. 3 depicts another exemplary semiconductor device in accordance with which embodiments may operate.

FIG. 3 depicts another exemplary semiconductor device 301 in accordance with which embodiments may operate.

Because the semiconducting oxide materials may be deposited anywhere, rather than having to be grown upon a native substrate, it is possible to incorporate the transistor on the backside of a device or the front side of a device. Additionally, because the Thin Film Transistors (TFTs) are so thin, it is possible to contact the semiconducting oxide channel 335 from either the top or the bottom.

Therefore, according to an alternative embodiment, there is a substrate 340 layer upon which the semiconducting oxide channel 335 material is deposited. A gate 305 and gate oxide material 315 is again provided surrounded by spacers 310. As depicted, the gate 305 may be on top and still modulate the channel resistance RCH 330 of the semiconducting oxide channel 335. Because of the disparate use of the semiconducting oxides for the channel 335 material and the high mobility liner 345 the transistor again benefits from reduced contact resistance Rc 320 and spreading resistance Rsp 325.

As shown here, vias are opened forming holes in the substrate 340, for instance, by etching holes into a silicon substrate within which the high mobility liner 345 may then be deposited to surround the metallic material which is subsequently deposited forming the contact via 300.

Due to the thinness of the semiconducting oxide channel 335 it is permissible to make contact from either side and therefore, the contact vias 300 may be opened, lined with the high mobility liner 345 and filled with the metallic contact forming the contact via on whichever side of the device is most convenient or most appropriate for the particular design objectives.

As depicted here, the contact vias 300 are opened into the substrate 340 material thus forming an opening entirely through the substrate 340 material to the semiconducting oxide channel 335 material thus making direct contact between the contact vias 300 and the high mobility liner 345 with the semiconducting oxide channel 335 material. Although not depicted here, it is alternatively possible to open the contact vias within a dielectric layer on a back side of the substrate 340, all the way to the semiconducting oxide channel 335 material such that the contact vias 300 and the high mobility liner 345 material comes into direct contact with the channel 335. Such alternative are dependent on the design objectives for the device as each is equally functional.

FIGS. 4A, 4B, 4C, 4D, and 4E depict exemplary process flows (401, 402, 403, 404, 406 and 407) for building a high mobility low contact resistance semiconducting oxide in metal contact vias for thin film transistors in accordance with described embodiments.

In particular, at operation 400 of FIG. 4A, a substrate 440 is fabricated. For instance, either silicon is fabricated or silicon layers upon silicon layers are formed as part of, for example, a back end interconnect region of a semiconductor device with the substrate being formed from any of a wide variety of available substrate materials such as silicon, silicon dioxide, aluminum oxide, sapphire, germanium, gallium arsenide (GaAs), an alloy of silicon and germanium, indium phosphide (InP), etc.

At operation 401, the semiconducting oxide channel 435 is formed upon the substrate 440 through which channel resistance RCH 430 will be modulated by the gate 405 of the fully formed and operational transistor. In accordance with certain embodiments, operation 401 includes a sputter process to deposit the semiconducting oxide channel 435 material or to sputter an amorphous oxide channel material (AOS channel) onto the substrate 440.

Contact resistance Rc 420 and spreading resistance Rsp 425 are depicted but will be reduced through the use of the formed multi-step semiconducting oxides transition from the source and drain regions from the metal of the contact vias yet to be deposited to the yet to be formed high mobility liner of the vias and ultimately into the semiconducting oxide channel 435.

It is preferable that the channel material forming the semiconducting oxide channel 435 layer exhibit reasonable mobility, though not necessarily as high as the high mobility liner coating the opened vias. Importantly, however, the semiconducting oxide channel 435 material should have a large band gap so that the semiconducting oxide channel 435 exhibits low leakage.

In accordance with a particular embodiment, the high band gap semiconducting oxide layer (amorphous or otherwise) is sputtered onto the previously formed substrate 440 and is then patterned such that the gate oxide material 415 may be deposited directly onto the semiconducting oxide channel 435 material.

At operation 402 the gate oxide material 415 is deposited onto the patterned semiconducting oxide channel 435 layer thus forming the gate oxide material 415 beneath the gate 405 with the metallic gate material being deposited on top of the gate oxide material 415.

The spacers 410 surrounding the gate 405 and gate oxide material 415 are created or positioned as shown. The spacers 410 form an area of separation from the gate 405 such that when the contact material is deposited into the contact vias it does not land on or make direct contact with the gate 405 which would result in a short.

Figure 4B:
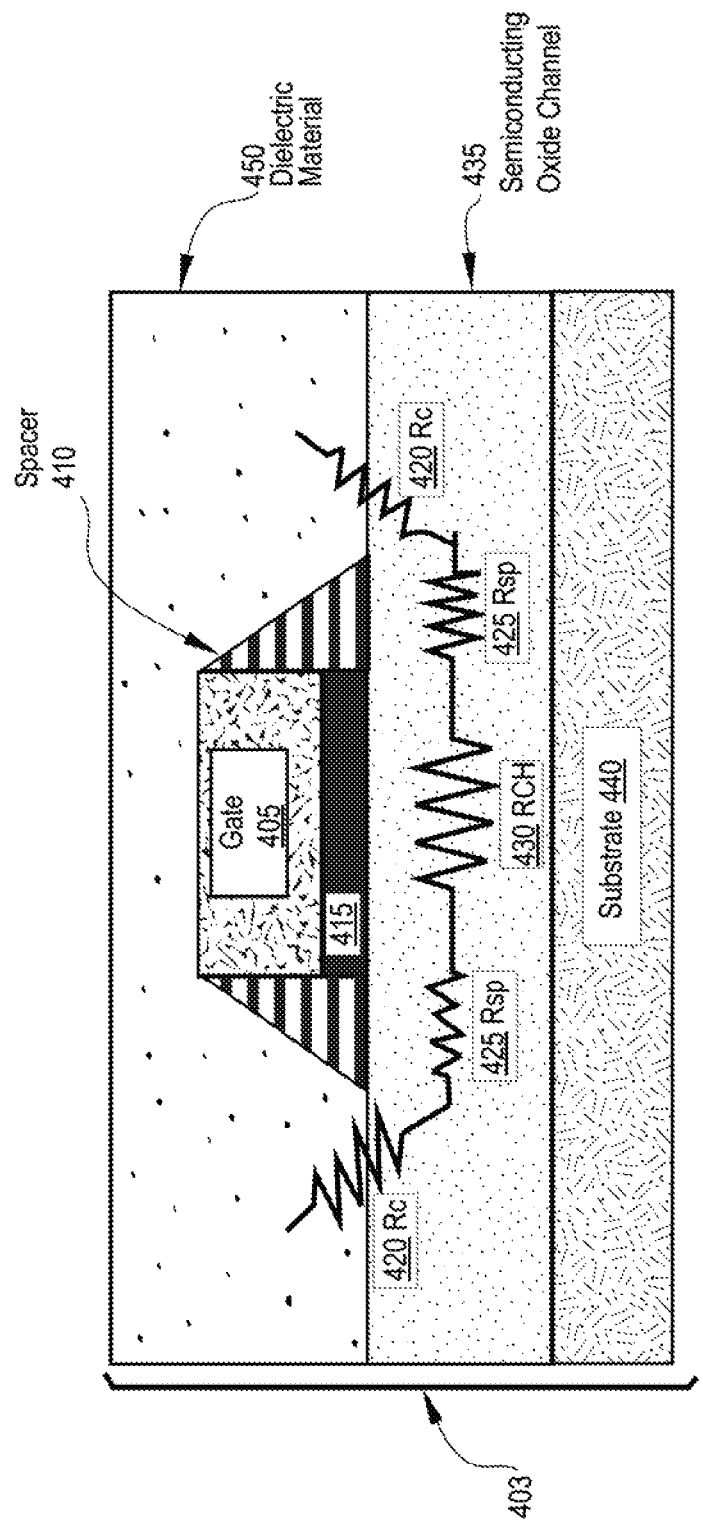

At operation 403 of FIG. 4B, a dielectric material 450 is deposited, overmolding the semiconductor device and protecting the gate 405 and gate oxide material 415 and the positioned spacers 410.

Figure 4C:
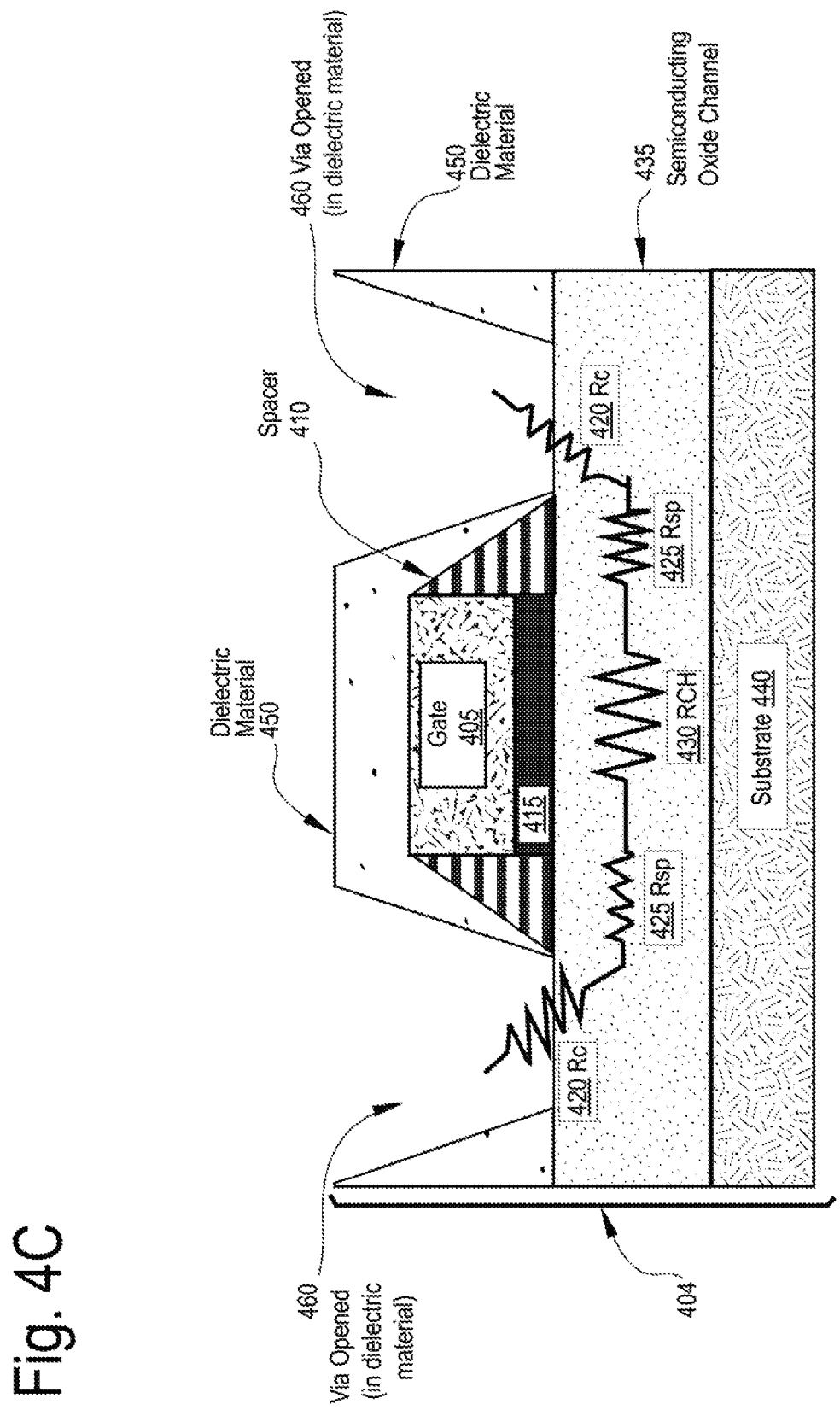

At operation 404 of FIG. 4C, a portion of the dielectric material 450 is etched away opening holes or "vias" thus forming the opened vias 460 into the dielectric material 450. The opened vias 460 provide a hole from the top surface all the way down to the semiconducting oxide channel 435 material such that the contacts will make direct contact with the semiconducting oxide channel 435. Notably, however, the contact vias once formed will include the high mobility liner which will be in direct contact with the semiconducting oxide channel 435 material and the metallic material of the formed contact vias must therefore transition from the contact metal through the liner to the channel material.

Figure 4D:
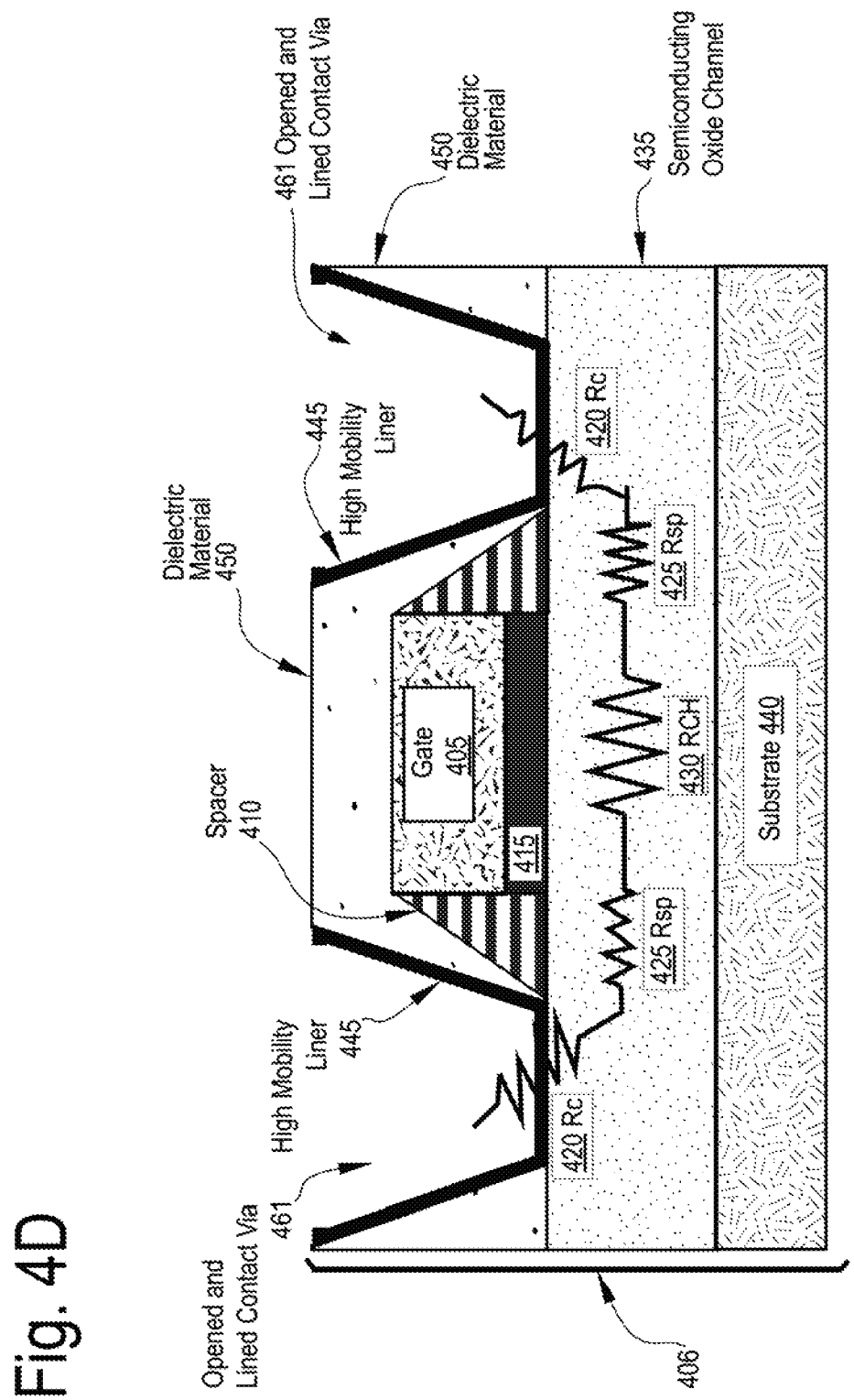

At operation 406 of FIG. 4D, a portion the opened vias 460 are now lined thus forming the opened and lined contact vias 461. For instance, the opened via 460 from FIG. 4C is lined with the high mobility liner 445 formed from a semiconducting oxide exhibiting high mobility characteristics as described previously to provide a step function between the contact to the channel so as to lower contact resistance Rc 420. The high mobility liner 445 may be deposited via Chemical Vapor Deposition (CVD), or Atomic Layer Deposition (ALD) methods forming a liner coating the opened vias as thin as 5-15 nanometers.

Figure 4E:
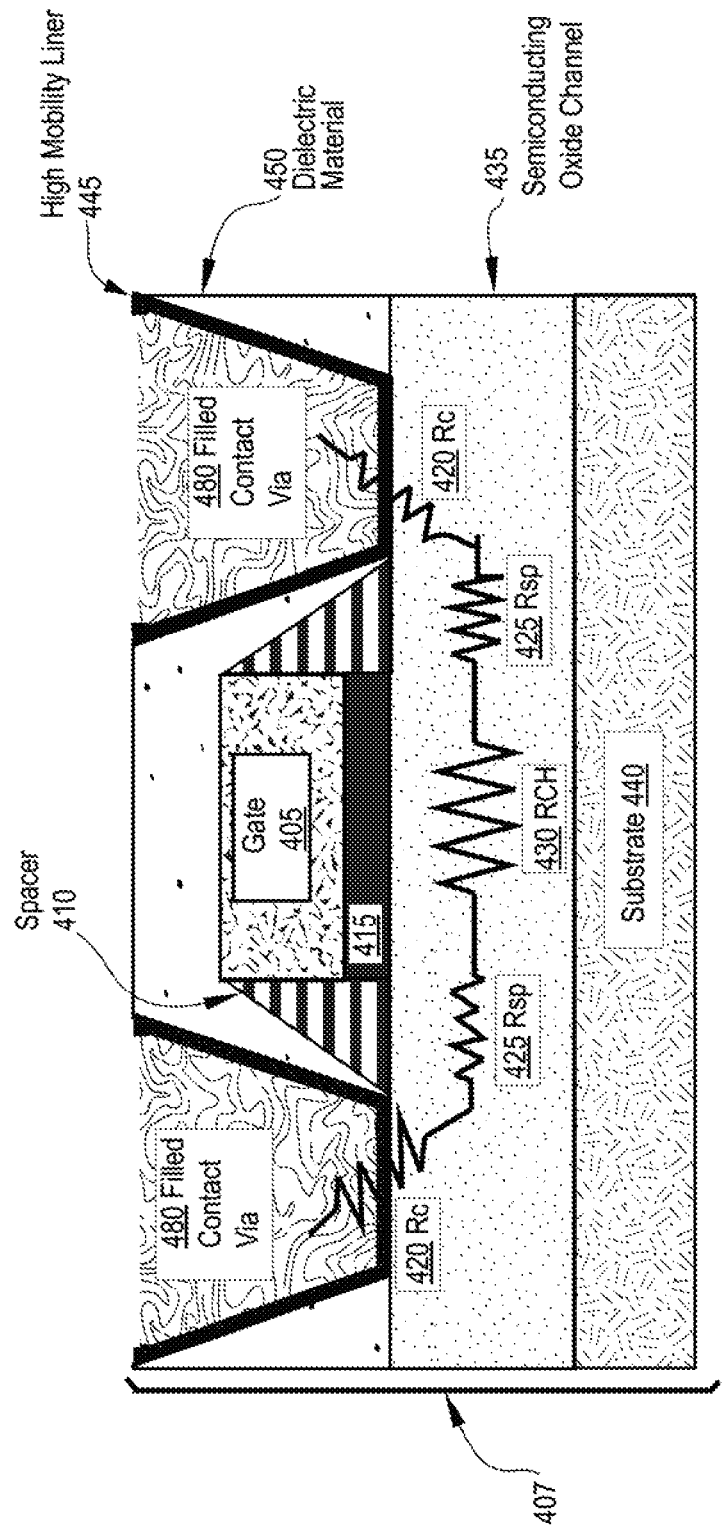

At operation 407 of FIG. 4E, the metallic material forming the contact is deposited into the opened and lined contact via 461 from FIG. 4D, thus forming the filled contact via 480 shown here, with a transitory semiconducting oxide layer formed from the high mobility liner between the metallic contact metal of the filled contact via 480 and the semiconducting oxide material utilized for the semiconducting oxide channel 435.

Figure 5:
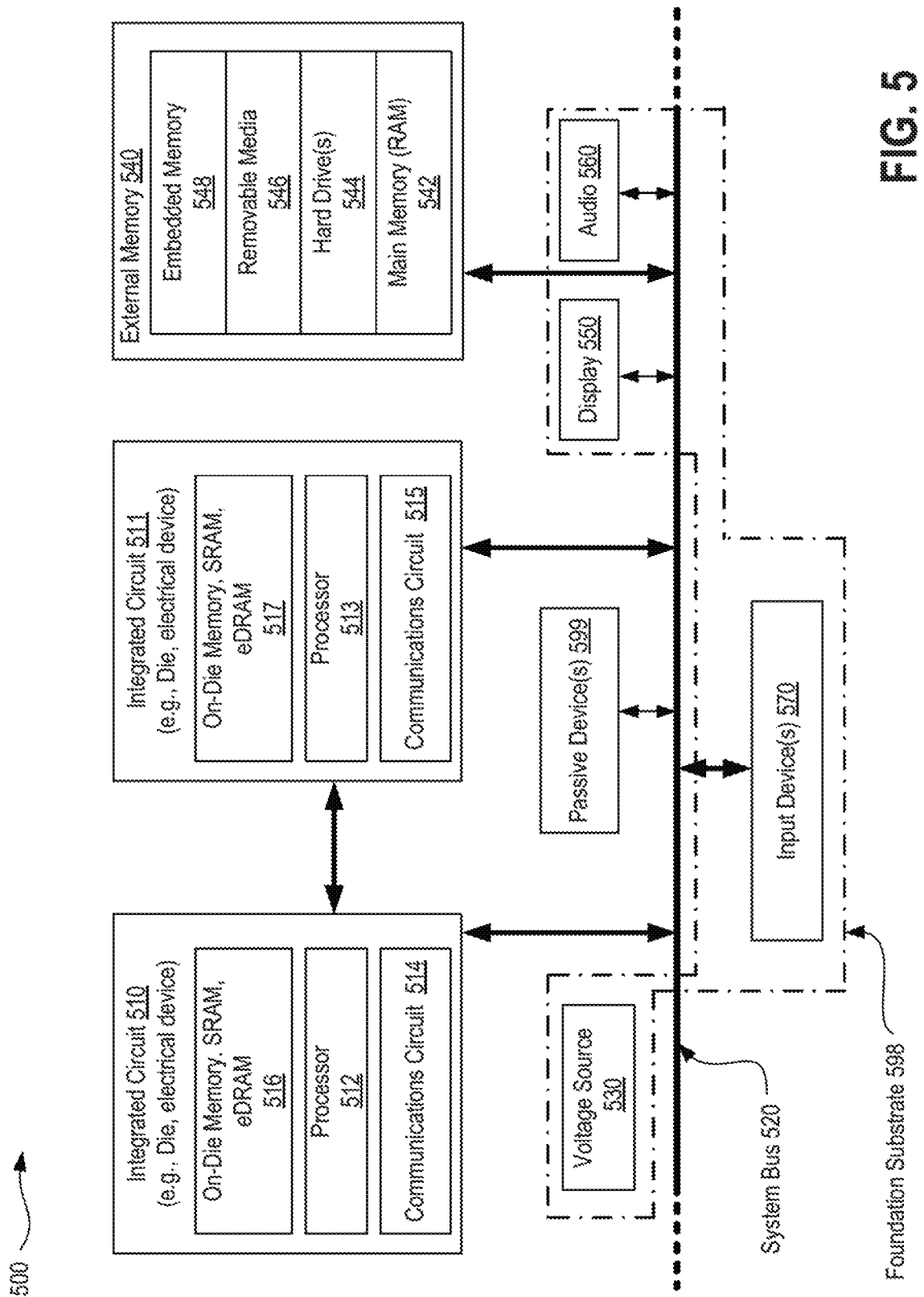
FIG. 5 is a schematic of a computer system in accordance with described embodiments.

FIG. 5 is a schematic of a computer system 500 in accordance with described embodiments. The computer system 500 (also referred to as the electronic system 500) as depicted can embody means for implementing a high mobility low contact resistance semiconducting oxide in metal contact vias for thin film transistors, according to any of the several disclosed embodiments and their equivalents as set forth in this disclosure. The computer system 500 may be a mobile device such as a net-book computer. The computer system 500 may be a mobile device such as a wireless smartphone or tablet. The computer system 500 may be a desktop computer. The computer system 500 may be a hand-held reader. The computer system 500 may be a server system. The computer system 500 may be a supercomputer or high-performance computing system.

In accordance with one embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

Such an integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. In an embodiment, the processor 512 includes, or is coupled with, electrical devices having gradient encapsulant protection, as disclosed herein.

In accordance with one embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems, or a communications circuit for servers. In an embodiment, the integrated circuit 510 includes on-die memory 516 such as static random-access memory (SRAM). In an embodiment, the integrated circuit 510 includes embedded on-die memory 516 such as embedded dynamic random-access memory (eDRAM).

In accordance with one embodiment, the integrated circuit 510 is complemented with a subsequent integrated circuit 511. Useful embodiments include a dual processor 513 and a dual communications circuit 515 and dual on-die memory 517 such as SRAM. In accordance with one embodiment, the dual integrated circuit 510 includes embedded on-die memory 517 such as eDRAM.

In one embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548 such as the first die in a die stack, according to an embodiment.

In accordance with one embodiment, the electronic system 500 also includes a display device 550 and an audio output 560. In one embodiment, the electronic system 500 includes an input device 570 such as a controller that may be a keyboard, mouse, trackball, game controller, microphone, voice-recognition device, or any other input device that inputs information into the electronic system 500. In an embodiment, an input device 570 is a camera. In an embodiment, an input device 570 is a digital sound recorder. In an embodiment, an input device 570 is a camera and a digital sound recorder.

As shown herein, the integrated circuit 510 can be implemented in a number of different embodiments, including a package substrate or a semiconductor package having therein means for implementing a high mobility low contact resistance semiconducting oxide in metal contact vias for thin film transistors, according to any of the several disclosed embodiments and their equivalents, an electronic system, a computer system, one or more methods of fabricating an integrated circuit, and one or more methods of fabricating an electronic assembly that includes a package substrate or a semiconductor package having therein means for implementing a high mobility low contact resistance semiconducting oxide in metal contact vias for thin film transistors, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates and semiconductor packages having means for implementing a high mobility low contact resistance semiconducting oxide in metal contact vias for thin film transistor embodiments and their equivalents. A foundation substrate 598 may be included, as represented by the dashed line of FIG. 5. Passive devices 599 may also be included, as is also depicted in FIG. 5.

Figure 6:
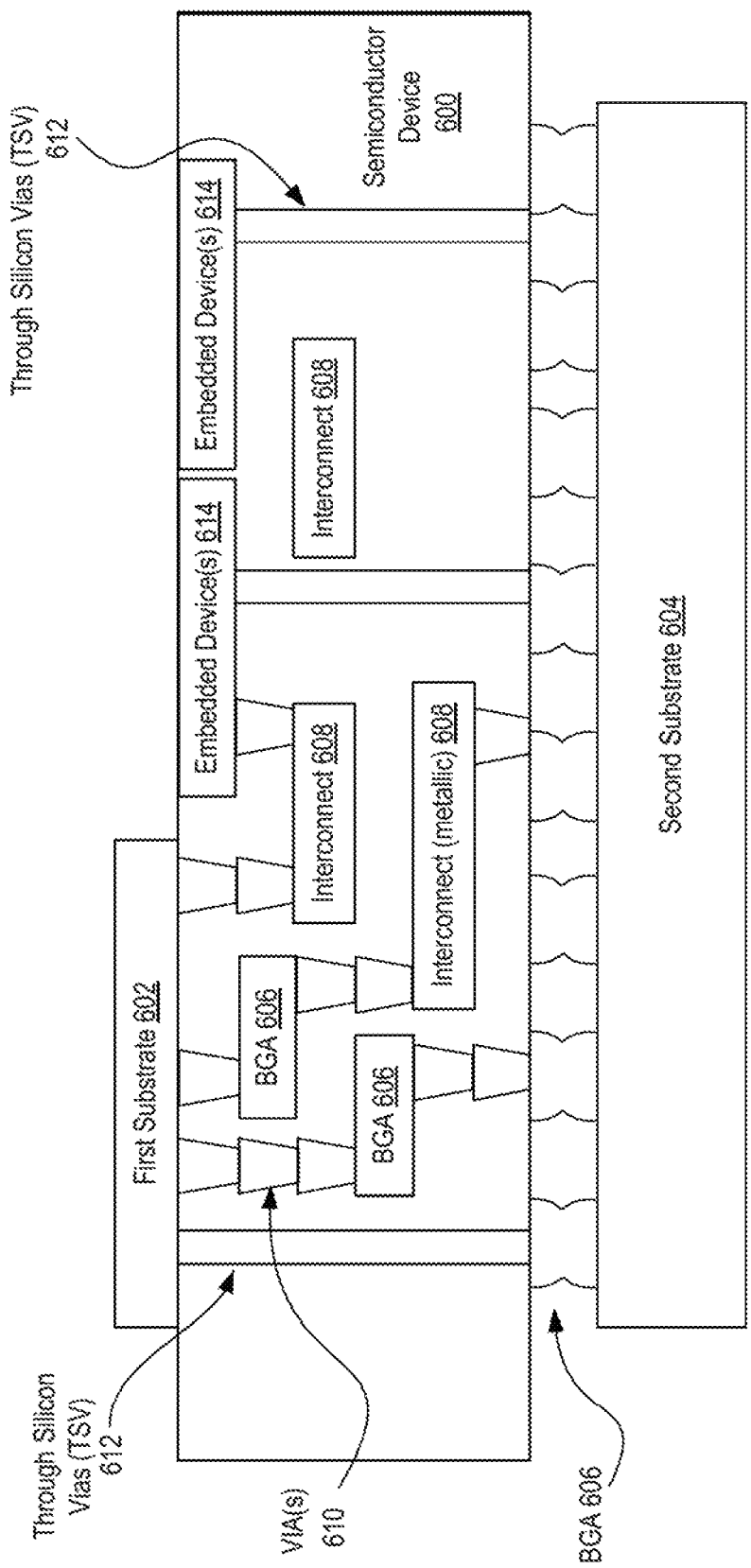
FIG. 6 illustrates a semiconductor device that includes one or more described embodiments.

FIG. 6 illustrates semiconductor device 600 that includes one or more described embodiments. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with described embodiments, apparatuses or processes disclosed herein may be used in the fabrication of interposer 600.

Figure 7:
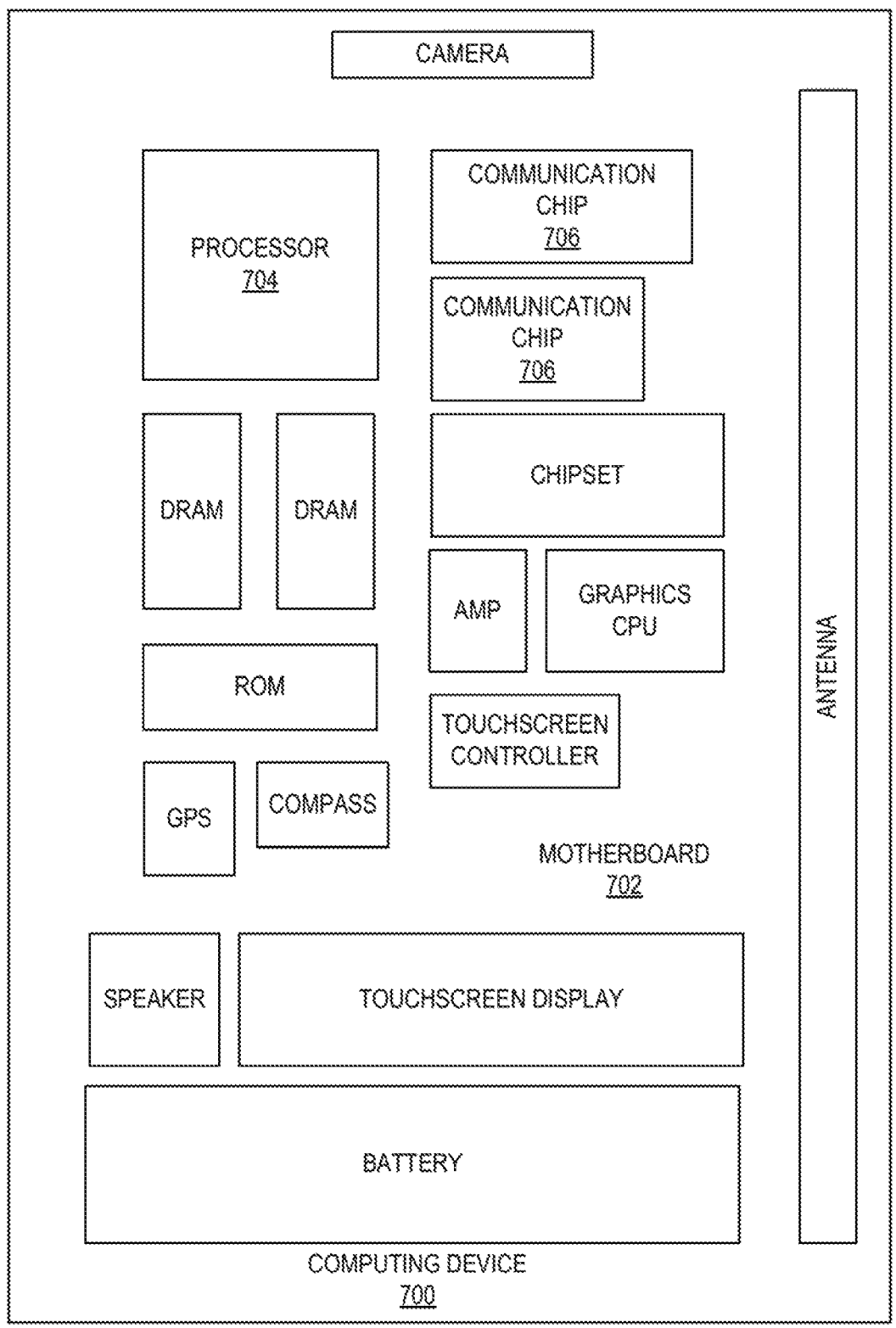
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
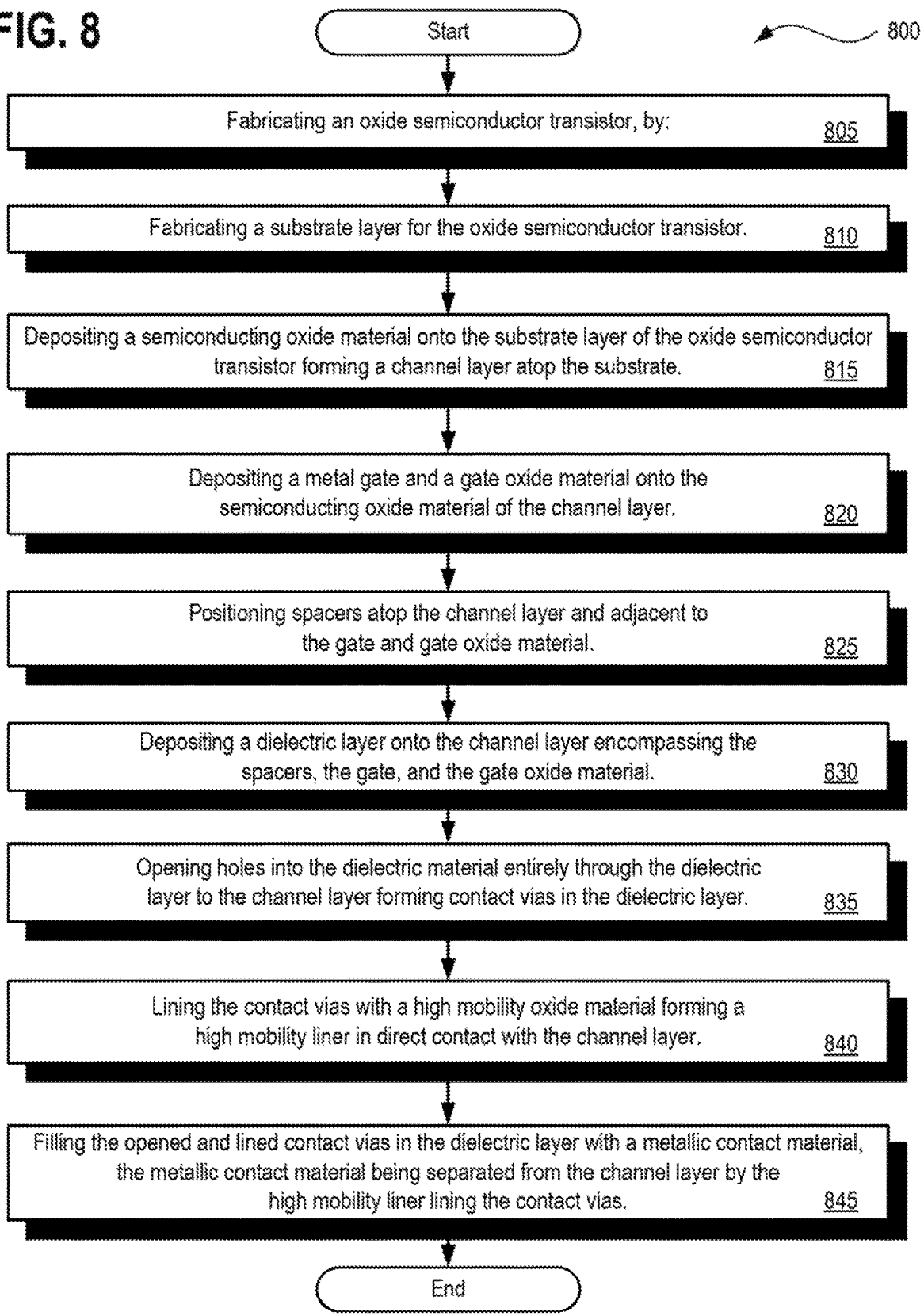
FIG. 8 is a flow diagram illustrating a method for implementing a high mobility low contact resistance semiconducting oxide in metal contact vias for thin film transistors in accordance with described embodiments.

FIG. 8 is a flow diagram illustrating a method 800 for implementing a high mobility low contact resistance semiconducting oxide in metal contact vias for thin film transistors in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from method 800 may be utilized in a variety of combinations.

At block 805 the method 800 for implementing a high mobility low contact resistance semiconducting oxide in metal contact vias for thin film transistors begins with fabricating an oxide semiconductor transistor by the following operations:

At block 810 the method includes fabricating a substrate layer for the oxide semiconductor transistor.

At block 815 the method includes depositing a semiconducting oxide material onto the substrate layer of the oxide semiconductor transistor forming a channel layer atop the substrate.

At block 820 the method includes depositing a metal gate and a gate oxide material onto the semiconducting oxide material of the channel layer.

At block 825 the method includes positioning spacers atop the channel layer and adjacent to the gate and gate oxide material.

At block 830 the method includes depositing a dielectric layer onto the channel layer encompassing the spacers, the gate, and the gate oxide material.

At block 835 the method includes opening holes into the dielectric material entirely through the dielectric layer to the channel layer forming contact vias in the dielectric layer.

At block 840 the method includes lining the contact vias with a high mobility oxide material forming a high mobility liner in direct contact with the channel layer.

At block 845 the method includes filling the opened and lined contact vias in the dielectric layer with a metallic contact material, the metallic contact material being separated from the channel layer by the high mobility liner lining the contact vias.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

It is therefore in accordance with the described embodiments, that:

According to one embodiment there is an oxide semiconductor transistor, the oxide semiconductor transistor having therein: a substrate layer; a channel layer formed atop the substrate; a metal gate and a gate oxide material formed atop the semiconducting oxide material of the channel layer; spacers positioned adjacent to the gate and gate oxide material; a dielectric layer formed atop the channel layer, the dielectric layer encompassing the spacers, the gate, and the gate oxide material; contact vias opened into the dielectric material forming an opening through the dielectric layer to the channel layer; a high mobility liner material lining the contact vias and in direct contact with the channel layer, the high mobility liner formed from a high mobility oxide material; and metallic contact material filling the contact vias opened into the dielectric material and separated from the channel layer by the high mobility liner of the contact vias.

According to another embodiment, the oxide semiconductor transistor is a Thin Film Transistor (TFT).

According to another embodiment, the oxide semiconductor transistor includes a non-planar rigid oxide semiconductor transistor or a non-planar non-rigid oxide semiconductor transistor.

According to another embodiment of the oxide semiconductor transistor, the high mobility liner material is formed from a high mobility and high conductivity semiconducting oxide having conductivity characteristics which are proportional to its mobility characteristics and in which the high mobility and high conductivity semiconducting oxide exhibits its conductivity characteristics which are inversely proportional to an effective mass of the high mobility and high conductivity semiconducting oxide material forming the high mobility liner.

According to another embodiment of the oxide semiconductor transistor, the channel layer is formed from a semiconducting oxide material having different material properties from the high mobility semiconducting oxide material from which the high mobility liner is formed.

According to another embodiment of the oxide semiconductor transistor, the high mobility liner reduces contact resistance from the metallic contact material filling the contact vias and the channel layer.

According to another embodiment of the oxide semiconductor transistor, the metal gate and the gate oxide material formed atop the channel layer includes the gate oxide material being in direct contact with a semiconducting oxide material forming the channel layer and in which the gate oxide material insulates the metal gate from the channel layer.

According to another embodiment of the oxide semiconductor transistor, the spacers positioned adjacent to the gate and gate oxide material provide separation between the metal gate and the metallic contact material of the contact vias to prevent shorting between the gate and the contact vias.

According to another embodiment of the oxide semiconductor transistor, the dielectric layer is formed from an insulating oxide material having distinct material properties from a semiconducting oxide material forming the channel layer and from a high mobility oxide material forming the high mobility liner of the contact vias.

According to another embodiment of the oxide semiconductor transistor, the dielectric layer includes an interlayer dielectric (ILD) layer formed from an insulating oxide material.

According to another embodiment of the oxide semiconductor transistor, the channel layer is formed from an amorphous semiconducting oxide material having a wider band gap than a high mobility oxide material forming the high mobility liner and in which the amorphous semiconducting oxide material exhibits lower leakage characteristics than the high mobility oxide material forming the high mobility liner.

According to another embodiment of the oxide semiconductor transistor, the channel layer is formed from a crystalline semiconducting oxide material; and in which a high mobility oxide material forming the high mobility liner exhibits higher mobility characteristics than the crystalline semiconducting oxide material forming the channel layer.

According to another embodiment of the oxide semiconductor transistor, the contact vias opened into the dielectric material include trenches etched into the dielectric layer down to the channel layer or partially into the channel layer.

According to another embodiment of the oxide semiconductor transistor, the high mobility liner is formed from one of: a high mobility oxide material; a low band gap oxide material; a highly doped oxide material; or a high mobility low band gap highly doped oxide material.

According to another embodiment of the oxide semiconductor transistor, the metallic contact material filling the contact vias opened into the dielectric material touch a source and a drain of the oxide semiconductor transistor through the contact vias opened into the dielectric material separated only by the high mobility liner material lining the contact vias.

According to another embodiment of the oxide semiconductor transistor, the high mobility liner lowers a barrier height for electrons passing from the metallic contact material filling the contact vias to the channel layer by passing through a high mobility oxide material forming the high mobility liner separating the channel layer from the metallic contact material of the contact vias.

According to another embodiment of the oxide semiconductor transistor, a semiconducting oxide material forming the channel layer exhibits off-state leakage properties which are less than off-state leakage properties characteristics of the high mobility liner and further in which the high mobility liner exhibits a potentially lower band gap than the semiconducting oxide material forming the channel layer.

According to another embodiment of the oxide semiconductor transistor, the high mobility liner includes one of: $SbO_2$, $SnO_2$, $InO_2$, ITO, TiO, ZO, or a high indium content IGZO.

In accordance with another embodiment there is a method of fabricating an oxide semiconductor transistor fabricating a substrate layer for the oxide semiconductor transistor; depositing a semiconducting oxide material onto the substrate layer of the oxide semiconductor transistor forming a channel layer atop the substrate; depositing a metal gate and a gate oxide material onto the semiconducting oxide material of the channel layer; positioning spacers atop the channel layer and adjacent to the gate and gate oxide material; depositing a dielectric layer onto the channel layer encompassing the spacers, the gate, and the gate oxide material; opening holes into the dielectric material entirely through the dielectric layer to the channel layer forming contact vias in the dielectric layer; lining the contact vias with a high mobility oxide material forming a high mobility liner in direct contact with the channel layer; and filling the opened and lined contact vias in the dielectric layer with a metallic contact material, the metallic contact material being separated from the channel layer by the high mobility liner lining the contact vias.

According to another embodiment of the method, depositing the semiconducting oxide material onto the substrate layer of the oxide semiconductor transistor forming the channel layer atop the substrate includes: growing a blanket of the semiconducting oxide material entirely covering the substrate layer; and patterning and etching the blanket of the semiconducting oxide material to a specified width to form the channel layer from the patterned and etched semiconducting oxide material.

According to another embodiment of the method, opening holes into the dielectric material entirely through the dielectric layer to the channel layer forming contact vias in the dielectric layer includes: etching trenches entirely through the dielectric material down to or partially into the semiconducting oxide material forming the channel layer, in which the etched trenches form the opened contact vias in the dielectric layer.

According to another embodiment of the method, lining the contact vias with the high mobility oxide material forming the high mobility liner in direct contact with the channel layer includes: depositing the high mobility liner into the contact vias via one of Chemical Vapor Deposition (CVD) or Atomic Layer Deposition (ALD).

According to another embodiment there is an electronics module including: a printed circuit board; a oxide semiconductor transistor electrically interfaced to the printed circuit board; and in which the oxide semiconductor transistor includes: (i) a substrate layer; (ii) a channel layer formed atop the substrate; (iii) a metal gate and a gate oxide material formed atop the semiconducting oxide material of the channel layer; (iv) spacers positioned adjacent to the gate and gate oxide material; (v) a dielectric layer formed atop the channel layer, the dielectric layer encompassing the spacers, the gate, and the gate oxide material; (vi) contact vias opened into the dielectric material forming an opening through the dielectric layer to the channel layer; (vii) a high mobility liner material lining the contact vias and in direct contact with the channel layer, the high mobility liner formed from a high mobility oxide material; and (viii) metallic contact material filling the contact vias opened into the dielectric material and separated from the channel layer by the high mobility liner of the contact vias.

According to another embodiment of the electronics module, the electronics module is embodied within one of: a drone and robot control electronics module; a smart phone electronics module; a tablet electronics module; a gesture control electronics module for a computer; a 3D photography electronics module; a 3D immersive gaming electronics module; a face recognition electronics module to perform face recognition base security in-lieu of alphanumerical passwords; an image capture device electronics module having one or more optical and Complementary metal-oxide-semiconductor (CMOS) components affixed to the printed circuit board as the top side or bottom side components; a depth sensing camera electronics module to perform any of stereoscopic imaging depth sensing, coded light depth sensing, or laser time of flight depth sensing.

According to another embodiment of the electronics module, the electronics module includes is embedded within a wearable technology to be worn as one of: a clothing item; sports attire; a shoe; fashion electronics to be worn as a clothing item or an accessory; tech togs to be worn as a clothing item or an accessory; or fashionable technology to be worn as a clothing item or an accessory.

What is claimed is:

1. An oxide semiconductor transistor, comprising:
   a substrate layer;
   a channel layer formed atop the substrate;
   a metal gate and a gate oxide material formed atop the semiconducting oxide material of the channel layer;
   spacers positioned adjacent to the gate and gate oxide material;
   a dielectric layer formed atop the channel layer, the dielectric layer encompassing the spacers, the gate, and the gate oxide material;
   contact vias opened into the dielectric material forming an opening through the dielectric layer to the channel layer;
   a high mobility liner material lining the contact vias and in direct contact with the channel layer, the high mobility liner formed from a high mobility oxide material; and
   metallic contact material filling the contact vias opened into the dielectric material and separated from the channel layer by the high mobility liner of the contact vias.

2. The oxide semiconductor transistor of claim 1, wherein oxide semiconductor transistor is a Thin Film Transistor (TFT).

3. The oxide semiconductor transistor of claim 1, wherein oxide semiconductor transistor comprises a non-planar rigid oxide semiconductor transistor or a non-planar non-rigid oxide semiconductor transistor.

4. The oxide semiconductor transistor of claim 1, wherein the high mobility liner material is formed from a high mobility and high conductivity semiconducting oxide having conductivity characteristics which are proportional to its mobility characteristics and wherein the high mobility and high conductivity semiconducting oxide exhibits conductivity characteristics which are inversely proportional to an effective mass of the high mobility and high conductivity semiconducting oxide material forming the high mobility liner.

5. The oxide semiconductor transistor of claim 4, wherein the channel layer is formed from a semiconducting oxide material having different material properties from the high mobility semiconducting oxide material from which the high mobility liner is formed.

6. The oxide semiconductor transistor of claim 1, wherein the high mobility liner reduces contact resistance from the metallic contact material filling the contact vias and the channel layer.

7. The oxide semiconductor transistor of claim 1, wherein the metal gate and the gate oxide material formed atop the channel layer comprises the gate oxide material being in direct contact with a semiconducting oxide material forming the channel layer and wherein the gate oxide material insulates the metal gate from the channel layer.

8. The oxide semiconductor transistor of claim 1, wherein the spacers positioned adjacent to the gate and gate oxide material provide separation between the metal gate and the metallic contact material of the contact vias to prevent shorting between the gate and the contact vias.

9. The oxide semiconductor transistor of claim 1, wherein the dielectric layer is formed from an insulating oxide material having distinct material properties from a semiconducting oxide material forming the channel layer and from a high mobility oxide material forming the high mobility liner of the contact vias.

10. The oxide semiconductor transistor of claim 1, wherein the dielectric layer comprises an interlayer dielectric (ILD) layer formed from an insulating oxide material.

11. The oxide semiconductor transistor of claim 1:
    wherein the channel layer is formed from an amorphous semiconducting oxide material having a wider band gap than a high mobility oxide material forming the high mobility liner and wherein the amorphous semiconducting oxide material exhibits lower leakage characteristics than the high mobility oxide material forming the high mobility liner.

12. The oxide semiconductor transistor of claim 1:
    wherein the channel layer is formed from a crystalline semiconducting oxide material; and
    wherein a high mobility oxide material forming the high mobility liner exhibits higher mobility characteristics than the crystalline semiconducting oxide material forming the channel layer.

13. The oxide semiconductor transistor of claim 1, wherein the contact vias opened into the dielectric material comprise trenches etched into the dielectric layer down to the channel layer or partially into the channel layer.

14. The oxide semiconductor transistor of claim 1, wherein the high mobility liner is formed from one of:
    a high mobility oxide material;
    a low band gap oxide material;
    a highly doped oxide material; or
    a high mobility low band gap highly doped oxide material.

15. The oxide semiconductor transistor of claim 1, wherein the metallic contact material filling the contact vias opened into the dielectric material touch a source and a drain of the oxide semiconductor transistor through the contact vias opened into the dielectric material separated only by the high mobility liner material lining the contact vias.

16. The oxide semiconductor transistor of claim 1, wherein the high mobility liner lowers a barrier height for electrons passing from the metallic contact material filling the contact vias to the channel layer by passing through a high mobility oxide material forming the high mobility liner separating the channel layer from the metallic contact material of the contact vias.

17. The oxide semiconductor transistor of claim 1, wherein a semiconducting oxide material forming the channel layer exhibits off-state leakage properties which are less than off-state leakage properties characteristics of the high mobility liner and further wherein the high mobility liner exhibits a potentially lower band gap than the semiconducting oxide material forming the channel layer.

18. The oxide semiconductor transistor of claim 1, wherein the high mobility liner comprises one of: SbO2, SnO2, InO2, ITO, TiO, ZO, or a high indium content IGZO.

19. A method of fabricating an oxide semiconductor transistor fabricating a substrate layer for the oxide semiconductor transistor;
depositing a semiconducting oxide material onto the substrate layer of the oxide semiconductor transistor forming a channel layer atop the substrate;
depositing a metal gate and a gate oxide material onto the semiconducting oxide material of the channel layer;
positioning spacers atop the channel layer and adjacent to the gate and gate oxide material;
depositing a dielectric layer onto the channel layer encompassing the spacers, the gate, and the gate oxide material;
opening holes into the dielectric material entirely through the dielectric layer to the channel layer forming contact vias in the dielectric layer;
lining the contact vias with a high mobility oxide material forming a high mobility liner in direct contact with the channel layer; and
filling the opened and lined contact vias in the dielectric layer with a metallic contact material, the metallic contact material being separated from the channel layer by the high mobility liner lining the contact vias.

20. The method of claim 19, wherein depositing the semiconducting oxide material onto the substrate layer of the oxide semiconductor transistor forming the channel layer atop the substrate comprises:
growing a blanket of the semiconducting oxide material entirely covering the substrate layer; and
patterning and etching the blanket of the semiconducting oxide material to a specified width to form the channel layer from the patterned and etched semiconducting oxide material.

21. The method of claim 19, wherein opening holes into the dielectric material entirely through the dielectric layer to the channel layer forming contact vias in the dielectric layer comprises:
etching trenches entirely through the dielectric material down to or partially into the semiconducting oxide material forming the channel layer, wherein the etched trenches form the opened contact vias in the dielectric layer.

22. The method of claim 19, wherein lining the contact vias with the high mobility oxide material forming the high mobility liner in direct contact with the channel layer comprises:
depositing the high mobility liner into the contact vias via one of Chemical Vapor Deposition (CVD) or Atomic Layer Deposition (ALD).

23. An electronics module comprising:
a printed circuit board;
a oxide semiconductor transistor electrically interfaced to the printed circuit board; and
wherein the oxide semiconductor transistor comprises:
(i) a substrate layer;
(ii) a channel layer formed atop the substrate;
(iii) a metal gate and a gate oxide material formed atop the semiconducting oxide material of the channel layer;
(iv) spacers positioned adjacent to the gate and gate oxide material;
(v) a dielectric layer formed atop the channel layer, the dielectric layer encompassing the spacers, the gate, and the gate oxide material;
(vi) contact vias opened into the dielectric material forming an opening through the dielectric layer to the channel layer;
(vii) a high mobility liner material lining the contact vias and in direct contact with the channel layer, the high mobility liner formed from a high mobility oxide material; and
(viii) metallic contact material filling the contact vias opened into the dielectric material and separated from the channel layer by the high mobility liner of the contact vias.

24. The electronics module of claim 23, wherein the electronics module comprises one of:
a drone and robot control electronics module;
a smartphone electronics module;
a tablet electronics module;
a gesture control electronics module for a computer;
a 3D photography electronics module;
a 3D immersive gaming electronics module;
a face recognition electronics module to perform face recognition base security in-lieu of alphanumerical passwords;
an image capture device electronics module having one or more optical and Complementary metal-oxide-semiconductor (CMOS) components affixed to the printed circuit board as the top side or bottom side components;
a depth sensing camera electronics module to perform any of stereoscopic imaging depth sensing, coded light depth sensing, or laser time of flight depth sensing.

25. The electronics module of claim 23, wherein the electronics module comprises is embedded within a wearable technology to be worn as one of:
a clothing item;
sports attire;
a shoe;
fashion electronics to be worn as a clothing item or an accessory;
tech togs to be worn as a clothing item or an accessory; or
fashionable technology to be worn as a clothing item or an accessory.

* * * * *